United States Patent [19]

Zeller et al.

[11] Patent Number: 4,567,546
[45] Date of Patent: Jan. 28, 1986

[54] ANCHOR BASE MOUNTING BLOCK

[75] Inventors: John C. Zeller, Schaumburg; Peter M. Wells, Jr., Sycamore, both of Ill.

[73] Assignee: All States Plastic Mfg. Co., Inc., Chicago, Ill.

[21] Appl. No.: 440,250

[22] Filed: Nov. 8, 1982

[51] Int. Cl.⁴ .............................................. H05K 7/04
[52] U.S. Cl. ................. 361/420; 174/138 D; 248/205.3; 248/206.5; 361/417; 361/419
[58] Field of Search ............. 361/331, 346, 354, 376, 361/384, 393, 392, 394, 395, 399, 400, 417, 419, 420, 429, 412, 413, 415, 352, 359–362; 248/222.3, 222.2, 73, 205.3, 206.5, 71, 500, 27.1; 174/138 D, 58; 24/304, 303, 442, 447, 453, 615, 663, 662, 664, 665, 499, 505, 297, 453, 590, 597, 663–665; 411/308, 309, 310; 339/88 R

[56] References Cited

U.S. PATENT DOCUMENTS

| | | | |
|---|---|---|---|
| 423,730 | 3/1890 | Charlton | 248/222.3 |
| 3,301,296 | 1/1967 | Meyer | 24/662 |
| 3,373,463 | 3/1968 | Wells | 24/297 |
| 3,809,799 | 5/1974 | Taylor | 248/205.3 |
| 4,007,516 | 2/1977 | Cohles | 174/138 D |
| 4,046,957 | 9/1977 | Taylor et al. | 174/138 D |
| 4,143,577 | 3/1979 | Eberhardt | 174/138 D |
| 4,159,506 | 6/1979 | Latasiewicz | 361/419 |
| 4,227,238 | 10/1980 | Saito | 361/417 |
| 4,379,536 | 4/1983 | Mizuno | 248/73 |

FOREIGN PATENT DOCUMENTS 1914092 12/1970 Netherlands ......................... 174/58

Primary Examiner—Reinhard J. Eisenzopf
Assistant Examiner—Gregory D. Thompson
Attorney, Agent, or Firm—Laff, Whitesel, Conte & Saret

[57] ABSTRACT

A mounting block for a plastic anchor base has a pressure sensitive covering (adhesive, magnetic, or the like) its lower surface so that it may be secured to a chassis, at any convenient location. The mounting block includes a hole of conventional dimensions leading to an internal cavity which receives and encloses the part of the anchor base which protrudes through a mounting hole. In some embodiments, the internal cavity also contains opposing cam surfaces which urge the resilient members on the anchor base to a released position when the anchor base is rotated. This way, the anchor base may be removed from the mounting block by giving the anchor base a partial turn and pulling. Another feature provides capture notches for receiving and locking said barbs when the anchor base is rotated.

14 Claims, 9 Drawing Figures

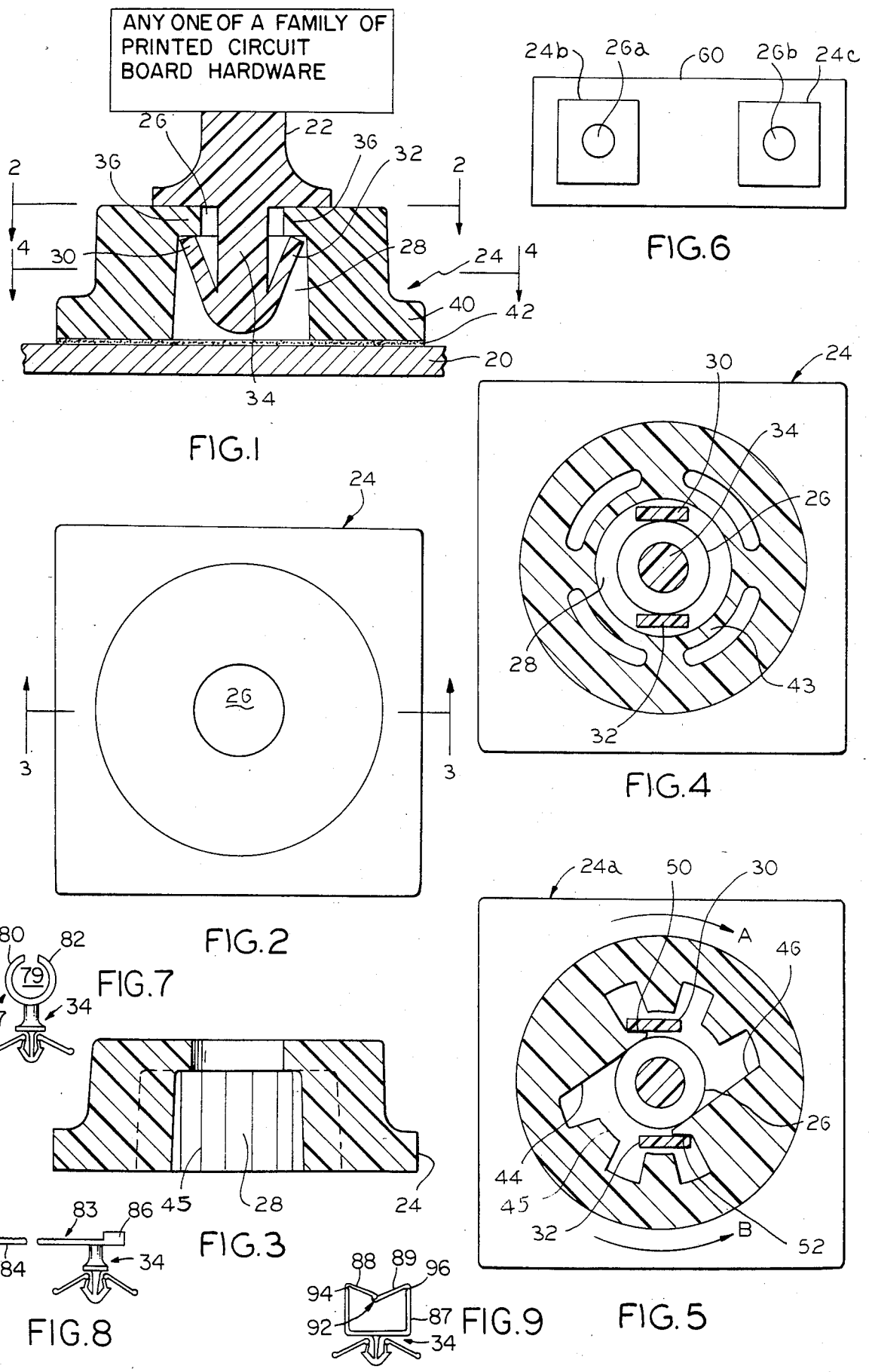

ANCHOR BASE MOUNTING BLOCK

This invention relates to mounts for plastic anchor bases and more particularly to mounting blocks—primarily but not exclusively—for use in supporting printed circuit boards and electronic enclosures.

BACKGROUND OF INVENTION

Anchor bases of the type described herein are plastic parts used primarily by the electronics industry. For example, an anchor base may be pushed through a hole in a chassis in order to mount something upon the chassis. For example, U.S. Pat. No. 4,143,577 shows an anchor base which may be used to mount a printed circuit board or other suitable device on a chassis. This leads to the development of a large family of different structures which may be used together with the anchor base in order to solve a great many problems, as is illustrated by a number of the figures in U.S. Pat. No. 4,143,577.

On the other hand, these anchor bases are not as versatile as they could be because a number of problems are encountered in their use. For example, there may be many reasons why one would not want to punch a mounting hole in a chassis, as when the chassis is a wall of a closed container, such as a radio or TV receiver housing. A hole would then allow moisture, dust, or electronic interference to enter the housing. Or perhaps, the same chassis might have to support a number of alternative printed circuit boards of different sizes, which would require either custom hole punchings or many useless pre-punched holes for mounting alternative sizes.

Still another consideration for or against the use of a conventionally mounted anchor base is found on the opposite side of the chassis, because the anchor base projects through the chassis and sticks out the other side. Therefore, it would interfere with setting the chassis on top of another surface, for example. Or, if the other side of the chassis is the outside of a housing, as mentioned above, any anchor base projecting through the housing would be unsightly. In some cases, it could lead to a hazardous condition if something should press against the outside of the housing and dislodge the anchor base and any component held thereby, perhaps causing a short circuit, or the like.

BRIEF SUMMARY OF INVENTION

Accordingly, an object of the invention is to provide new and improved ways of mounting anchor bases without requiring holes formed in associated supporting structures. Here, an object is to provide means for and methods of enabling customized anchor base mountings, without requiring a customized formation of a mounting hole.

Another object of the invention is to accomplish the foregoing objects without sacrificing the flexibility realized by a use of an entire, existing family of anchor base supported structures. Quite the contrary, an object is to enable the use of any suitable device having the pertinent anchor base thereon.

Another object of the invention is to provide new and improved printed circuit board hardware.

In keeping with an aspect of the invention, these and other objects of the invention are accomplished by a mounting block having a pressure sensitive adhesive or magnetic covering its lower surface. The upper surface of the mounting block includes a mounting hole of dimensions which are conventional for a given anchor base, the hole leading to an internal cavity which receives and encloses the part of the anchor base which protrudes through the mounting hole. In some embodiments, the internal cavity contains opposing cam surfaces which urge barbs on the anchor base to a released position when the base is rotated. This way, the mounting block may be secured to a chassis in any convenient location, and yet the anchor base may be removed from the mounting block by giving the base a half-turn and pulling.

BRIEF DESCRIPTION OF DRAWINGS

A preferred form of the invention is shown in the attached drawing, in which:

FIG. 1 is a cross section view of the invention mounting block installed on a chassis, with an anchor base captured therein;

FIG. 2 is a plan view of the mounting block, when viewed from the plane 2—2 of FIG. 1;

FIG. 3 is a cross sectional view of the mounting block taken along lines 3—3 of FIGS. 2;

FIG. 4 is a cross sectional view of the mounting block taken along line 4—4 of FIG. 1;

FIG. 5 is a cross sectional view of a second embodiment featuring a releasable mounting block;

FIG. 6 shows a mounting block having a plurality of mounting holes formed therein;

FIG. 7 is an elevation view of the anchor base, integral with a component mounting device;

FIG. 8 is an elevation view of the anchor base, integral with a cable tie device; and FIG. 9 is an elevation view of the anchor base, integral with a wire saddle clamp.

DETAILED DESCRIPTION

In FIG. 1, chassis 20 supports an anchor base 22, which may be used for any suitable purpose. The anchor base 22 may be that shown in U.S. Pat. No. 4,143,577 or any other similar device. This patent shows a family of devices on the top of an anchor base for mounting any of many different pieces of hardware on a printed circuit board. FIG. 1 incorporates these and other similar mounts by means of a rectangle with the label "Anyone of a Family of Printed Circuit Board Hardware". FIGS. 5–7 of U.S. Pat. No. 4,143,577 are reproduced herein as FIGS. 7-9, respectively, to show such hardware by way of example. The object of the invention is to enable the anchor base 22 to be located at any convenient place on the chassis 20, without requiring either a mounting hole in, or a projection of the anchor base out the other side of the chassis 20.

This object is accomplished by providing a mounting block 24 which is adhered to the chassis in any suitable location. The block contains a mounting hole 26 and an internal cavity 28. The hole 26 is the prescribed size for mounting anchor base 22. The internal cavity 28 is large enough to receive the entire part of the anchor base which would otherwise project through the chassis and stick out the back.

In this case, the anchor base contained within the cavity includes a pair of any suitable resilient interference protrusions (hereinafter called "barbs") 30, 32 which are integrally formed on the end of a spar 34. Any other suitable anchor base may be used. The barbs 30, 32 are squeezed through mounting hole 26 when the anchor base 22 is pushed into place. Once pushed through the mounting hole, the plastic memory of the anchor base causes the barbs 30, 32 to spring out so that they are captured under a flange 36 which forms the side of the mounting block 24 having the surface containing the hole 26. Thereafter, this form of anchor base cannot be conveniently removed from the mounting block, unless it has the removable feature of FIG. 5. Alternatively, a removable anchor base may be designed to have tabbed barbs which fit through the hole 26, with the tabs extending out of the hole when the base is in place. If those tabs are squeezed together, the base may be removed.

The mounting block 24 has a lower anchor flange 40 providing any suitable attachment means. For example, flange 40 may be covered by double sided pressure sensitive adhesive tape, or an adhesive backed magnetic tape of a type which is currently available from the Minnesota Mining and Manufacturing Company or Flexmag Industries, respectively. Thus, if a release paper (not shown) is peeled away from the bottom of the adhesive tape 42, a pressure sensitive adhesive is exposed. The flange 40 of mounting block 25 may then be pressed onto any suitable and convenient surface. Other suitable attaching means may include such things as magnets, vacuum cups, or the like.

In order to conserve plastic, it is desirable to reduce the thickness of a wall, wherever possible. Thus, for example, FIGS. 3 and 5 show a plurality of vertical flutes 45 distributed around the internal wall of cavity 26. These flutes preserve the vertical strength of a wall that thick, without requiring all of the plastic which otherwise would be required to make the wall that thick. Sometimes, it is easier to make a mold which gives four or more, somewhat circumferential slots, extending partially throught the block. These slots form an internal circular wall 43 (FIG. 4). The effect is the same, i.e. to conserve plastic while maintaining vertical strength. Especially if the base is made with a circular wall 43, as shown in FIG. 4, the anchor base may easily rotate to any position (i.e. rotate about the axis of part 34 as indicated by arrows A, B in FIG. 5). Thus, if the above mentioned family of anchor base supported structures is a wire saddle or cable tie, for example, which should be aligned in a convenient manner to receive wires, it is easy to make the alignment during an installation of the wires.

In the releasable embodiment of FIG. 5, two opposing cam surfaces 44, 46 are formed in the interior fluted wall of the mounting block 24a. Therefore, if the anchor base 22 is rotated in direction A, the barbs 30, 32 are forced against the cam surfaces 44, 46 and deflected inwardly toward the center of hole 26. When the barbs are deflected inwardly far enough to clear the circumference, the anchor base 22 may be removed by simply pulling it out of the hole 26.

To provide a locking feature, if it is desired, a radial surfaces on the cams or another suitable abuttment may be shaped to form locking notches 50, 52. When the anchor base 22 is rotated in direction B, the barbs 30, 32 are captured and latched into a locked position when they are forced into those notches 50, 52. The locking feature provided by notches 50, 52 and the releasing feature provided by cam surfaces 44, 46 do not necessarily have to be used together.

FIG. 6 shows that a single base 60 may be formed as a plurality of mounting blocks 24b, 24c containing mounting holes 26a, 26b.

The invention may be used anytime that it is necessary or desirable to anchor a device in a mounting block. For example, the clamp 77 of FIG. 7 may be used to secure an electronic component onto a chassis. The anchor base 34 of FIG. 7 may be pushed through a mounting hole in the inventive mounting block. Then, any generally cylindrical object may be pushed into the circular space 79 embraced by the arms 80, 82, integrally attached to anchor base 34 of FIG. 1.

FIG. 8 shows another exemplary device which may be used with the inventive anchor base mounting block. A cable tie 83 comprises a strap 84 having a rack of upstanding teeth formed transversely thereon. At the opposite end of strap 84 is a clamping head 86 which contains a toothed pawl (not seen in FIG. 8) for taking a bite upon the rack on strap 84. Thus, the strap 84 may be wrapped around a bundle of wires, threaded through head 86, pulled tightly, and held in place by the pawl. Then, the cable tie may be mounted by pushing the anchor base 34 of FIG. 1 through a hole in the inventive mounting block.

FIG. 9 shows another examplary use of the anchor base 34. An upstanding frame 87, on the anchor base 34, includes a pair of arms 88, 89 having interlocking ends 92, pivoted on living hinges 94, 96. Thus, a wire may be pressed against the interlocking ends 92, arms 88, 89 swing to an open position and spring back to the closed position.

Those who are skilled in the art will readily perceive how to modify the invention. Therefore, the appended claims are to be construed to cover all equivalent structures which fall within the true scope and spirit of the invention.

The invention claimed is:

1. A plastic mounting block which receives and captures an anchor base of a type used for mounting electronic components on a metal chassis said anchor base having a somewhat arrowhead shape with resilient interferring protrusion barbs extending therefrom, said mounting block comprising a block having upper and lower surfaces with side walls therebetween to form a cavity, said mounting block being slightly larger than said anchor base and said cavity being shaped and dimensioned to receive and contain only said anchor base, a single anchor base mounting hole in said upper surface, said hole being centrally located over and communicating with said cavity, said hole being formed in the top of said block in the size and shape required to receive and capture said anchor base while deflecting said barbs inwardly, whereby said hole and cavity comprise means receiving and capturing said anchor base, a flange formed by the top of said cavity and the upper surface of the block through which said hole passes, said flange capturing the barbs when they relax from the deflected position, said anchor base being free to rotate over at least a substantial arc when in the cavity, and attachment means on the lower surface of said mounting block for securing it to said chassis, whereby said mounting block enables said anchor base to be mounted on said chassis without requiring a mounting hole in said chassis.

2. The mounting block of claim 1 and opposing cam surfaces in said cavity for guiding and inwardly directing said protrusions of said anchor base when it is rotated in order to release said anchor base from said mounting block.

3. The mounting block of claim 1 and locking notch means formed in said cavity for capturing said barbs responsive to a rotation of said anchor base.

4. The mounting block of claim 1 wherein said attachment means is an adhesive means provided on said lower surface.

5. The mounting block of claim 1 wherein said attachment means is a magnetic means provided on said lower surface.

6. The mounting block of claim 1 with multiple mounting holes.

7. The mounting block of claim 1 wherein said cavity in said mounting block has a smooth internal substantially circular wall whereby said anchor base may rotate about an axis of said circular wall to any position.

8. The mounting block of claim 1 wherein said cavity has internal contours which enable said anchor base to rotate freely within said cavity.

9. A device for mounting components of a type associated with a printed circuit board on a chassis for electronic components without requiring an aperture in said chassis for receiving and capturing an anchor base comprising a plastic mounting block having internal surface walls which define between them a cavity which is only slightly larger than said anchor base, one of said internal surfaces having an aperture an attaching means on a lower surface of said block for clinging to another surface, said block being attached to said chassis by said attaching means being pressed against and clinging to an undedicated surface area on that chassis, a family of printed circuit board hardware components, each of said components having an anchor base with elongated attaching and capturing barbs which fit into said cavity deflecting when entering said aperture on said block and relaxing to substantially fill said cavity after passing through said aperture, and said cavity within said mounting block receiving and rotatably holding only said anchor base by capturing the ends of said elongated barbs under a flange as the barbs relax from their deflected position, whereby said entire family of hardware components may be mounted at substantially anyplace on the surface of said chassis by pressing said mounting block in place.

10. The mounting block of claim 9 wherein a space is provided under said flange, which space is free of any obstructions which would prevent said rotation of said anchor base, whereby said anchor base may rotate freely around a 360° circumference circumscribing an axis of said anchor base.

11. A device for mounting components of a type associated with a printed circuit board comprising a plastic mounting block having an attaching lower surface, whereby said block is attached to a chassis by being pressed against a surface of that chassis, a family of printed circuit board hardware components, each of said components having an anchor base with attaching and capturing barbs which deflect when entering said block, cavity means in said mounting block for receiving and rotatably holding said anchor base by capturing said barbs under a flange as the barbs relax from their deflected position, whereby said entire family of hardware components may be mounted at substantially anyplace on the surface of said chassis by pressing said mounting block in place, and opposing cam surfaces inside said cavity means for guiding and inwardly directing said barbs of said anchor base when it is rotated in order to release said anchor base from said mounting block.

12. A device for mounting components of a type associated with a printed circuit board comprising a plastic mounting block having an attaching lower surface, whereby said block is attached to a chassis by being pressed against a surface of that chassis, a family of printed circuit board hardware components, each of said components having an anchor base with attaching and capturing barbs which deflect when entering said block, cavity means in said mounting block of receiving and rotatably holding said anchor base by capturing said barbs under a flange as the barbs relax from their deflected position, whereby said entire family of hardware components may be mounted at substantially anyplace on the surface of said chassis by pressing said mounting block in place, said cavity means in said mounting block having inwardly directed abuttment walls with locking notches therein, said locking notches capturing and holding said barbs as said anchor base is rotated.

13. A combination of a mounting block and an anchor base, said mounting block comprising a block having upper and lower surfaces and a cavity therebetween, said cavity being shaped and dimensioned to receive and contain said anchor base, an anchor base mounting hole in said upper surface and communicating with said cavity, said hole being formed in the top of said block in the size and shape required to receive and capture said anchor base, whereby said hole and cavity comprise means for receiving said anchor base, attachment means on the lower surface of said mounting block for securing it to a chassis, said anchor base having a somewhat arrowhead shape with resilient interferring protrusions therefrom, said protrusions being shaped and proportioned relative to said cavity and mounting hole so that said protrusions are captured beneath a flange formed by the top of said cavity and the upper surface of the block through which said hole passes, and opposing cam surfaces in said cavity for guiding and inwardly directing said protrusions of said anchor base when it is rotated in order to release said anchor base from said mounting block.

14. A combination of a mounting block and an anchor base, said mounting block comprising a block having upper and lower surfaces and a cavity therebetween, said cavity being shaped and dimensioned to receive and contain said anchor base, an anchor base mounting hole in said upper surface and communicating with said cavity, said hole being formed in the top of said block in the size and shape required to receive and capture said anchor base, whereby said hole and cavity comprise means for receiving said anchor base, attachment means on the lower surface of said mounting block for securing it to a chassis, said anchor base having a somewhat arrowhead shape with resilient interferring protrusions therefrom, said protrusions being shaped and proportioned relative to said cavity and mounting hole so that said protrusions are captured beneath a flange formed by the top of said cavity and the upper surface of the block through which said hole passes, and locking notch means formed in said cavity for capturing said protrusions responsive to a rotation of said anchor base.

* * * * *